United States Patent
Tang et al.

(10) Patent No.: US 11,669,472 B2
(45) Date of Patent: *Jun. 6, 2023

(54) FREQUENCY TRANSLATION CIRCUITRY FOR AN INTERCONNECTION IN AN ACTIVE INTERPOSER OF A SEMICONDUCTOR PACKAGE

(71) Applicant: Intel Corporation, Santa Clara, CA (US)

(72) Inventors: Lai Guan Tang, Tanjung Bungah (MY); Ankireddy Nalamalpu, Portland, OR (US); Dheeraj Subbareddy, Portland, OR (US); Chee Hak Teh, Bayan Lepas (MY); Md Altaf Hossain, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/543,433

(22) Filed: Dec. 6, 2021

(65) Prior Publication Data

US 2022/0092009 A1    Mar. 24, 2022

Related U.S. Application Data

(63) Continuation of application No. 16/726,132, filed on Dec. 23, 2019, now Pat. No. 11,216,397.

(51) Int. Cl.
*G06F 13/20* (2006.01)
*G06F 13/40* (2006.01)

(52) U.S. Cl.
CPC .......... *G06F 13/20* (2013.01); *G06F 13/4027* (2013.01)

(58) Field of Classification Search
CPC .... G06F 13/20; G06F 13/362; G06F 13/3625; G06F 13/387; G06F 13/4027; H01L 23/538; H01L 23/5381; H01L 23/5383
See application file for complete search history.

(56) References Cited

U.S. PATENT DOCUMENTS

| | | | |
|---|---|---|---|
| 9,106,229 B1 | 8/2015 | Hutton et al. | |
| 11,216,397 B2 * | 1/2022 | Tang | H01L 25/0655 |
| 2012/0147567 A1 | 6/2012 | Lee et al. | |
| 2015/0116001 A1 | 4/2015 | Rahman et al. | |
| 2017/0200672 A1 | 7/2017 | Jayasena et al. | |
| 2019/0065427 A1 * | 2/2019 | Wortman | H04J 3/02 |
| 2019/0181865 A1 | 6/2019 | Leong | |

FOREIGN PATENT DOCUMENTS

WO    2019132966 A1    7/2019

OTHER PUBLICATIONS

Extended European Search Report for EP Application No. 20196361.8 dated Dec. 3, 2020.

* cited by examiner

*Primary Examiner* — Raymond N Phan
(74) *Attorney, Agent, or Firm* — Fletcher Yoder, P.C.

(57) ABSTRACT

Systems and method include one or more die coupled to an interposer. The interposer includes interconnection circuitry configured to electrically connect the one or more die together via the interposer. The interposer also includes translation circuitry configured to translate communications as they pass through the interposer. For instance, in the interposer, the translation circuitry translates communications, in the interposer, from a first protocol of a first die of the one or more die to a second protocol of a second die of the one or more die.

20 Claims, 5 Drawing Sheets

FREQUENCY TRANSLATION CIRCUITRY FOR AN INTERCONNECTION IN AN ACTIVE INTERPOSER OF A SEMICONDUCTOR PACKAGE

CROSS REFERENCE TO RELATED APPLICATIONS

This application is a continuation of U.S. application Ser. No. 16/726,132, filed Dec. 23, 2019, entitled "Translation Circuitry for an Interconnection in an Active Interposer of a Semiconductor Package," which is hereby incorporated by reference in its entirety for all purposes.

BACKGROUND

The present invention relates generally to electronic devices using multiple communicative electronic chips or chiplets.

Electronic systems and electronic devices are becoming faster and more efficient in data processing to keep up with the ever increasing push for faster processing of large volume of data. Some data processing systems may include electronic devices that may include multiple electronic chips and chiplets, among other things, communicatively coupled to perform data processing tasks. The multiple chips or chiplets in a data processing task may be programmable logic devices, application-specific integrated circuits, processors, transceivers or any other electronic circuit component capable of digital communication.

The aforementioned digitally communicative circuit components may use various communication protocols as a set of communication standards for transmission and reception of data to other circuit components. Various communication protocols may use different sets of resources for transmission and reception of data. The use of the various sets of resources may be due to various sets of communication rules imposed by a protocol, such as different speed rates, voltage levels, data encoding and decoding methods, and physical layouts, among other things. A data processing system may use interconnection circuitry between various digitally communicative circuit components where any one of the components may process or handle data using similar or different data processing protocols.

The use of a specific protocol in a specific digital chip or chiplet may be optimal for the chip or chiplet design and a scaled data processing system may use various chip or chiplets using various different communication protocols. In some packages chips of the different communication protocols or versions may not be used to communicate without translating communications on one of the die. Implementation of protocol translation circuitry inside a chip may create a design overhead for some data processing systems due to increased size of a chip equipped with protocol translation circuitry, added power overhead to the system for data transmission between two components with different voltage levels and longer time to market due to implementation time of protocol translation circuitry inside component(s). Additionally or alternatively, a release of a package using a die with a new communication protocol and/or new protocol version may be delayed until the other die(s) in the package are configured to work with the new communication and/or new protocol version.

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

SUMMARY

Certain aspects commensurate in scope with the originally claimed invention are set forth below. It should be understood that these aspects are presented merely to provide the reader with a brief summary of certain forms of the invention might take and that these aspects are not intended to limit the scope of the invention. Indeed, the invention may encompass a variety of aspects that may not be set forth below.

Various dies configured for data communication, in chiplets, may use various data communication protocols or versions of protocols. These die may be communicatively interconnected. To provide data communication across protocols or versions, translation circuitry may be included in an active interposer or interconnect bridge between the dies. The translation circuitry may provide data translation between the dies to enable backwards compatibility or flexible connections without designing such flexibility into the die themselves.

The translation circuitry may accommodate physical differences, encoding differences, and/or timing rate differences of data transmission, among other things, between the dies. The translation circuitry may be implemented within an interposer or substrate medium of a chip including the multiple chiplets including one or more dies. The implementation of the translation circuitry outside of the chiplets in a package may enable a device or package to reduce power consumption for the device or package. Additionally or alternatively, the backwards compatibility provided by the translation circuitry enables chips/chiplets to be designed faster and brought to market quicker due to the chips/chiplets being able to be used with dies having different protocols without designing such flexibility into the dies themselves. Such flexibility in the interconnection without using backwards compatibility in multiple chiplets, reduced chiplet size, and reduced circuit size subsequently.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
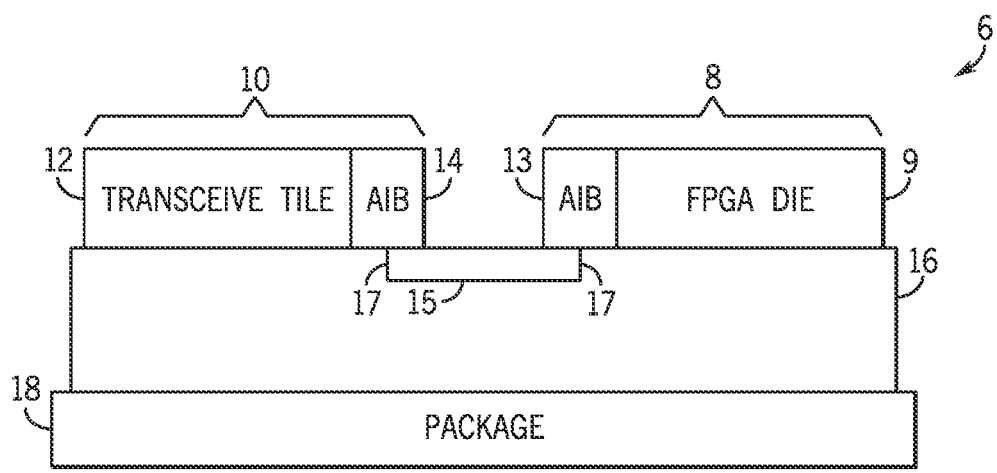
FIG. 1 depicts a package with two chiplets communicatively coupled using a common interconnect standard, through a passive interposer domain, in accordance with an embodiment.

A package 6 of FIG. 1 is a portion of a computing device including of a chiplet 8. The chiplet 8 may include Field Programmable Gate Array (FPGA) or another programmable logic die. The package 6 also includes a transceiver chiplet 10 that may be communicatively coupled through interconnect circuitry 15. The chiplet 8 may include an FPGA die 9 (or other circuitry) and an interconnect circuitry 13, among other things. For instance, the interconnect circuitry may include an Advanced Interconnect Bus (AIB). The transceiver chiplet 10 may include a transceiver tile 12 and an interconnect circuitry 14, among other things. The interconnect circuitry 14 may include an AIB. The interconnect circuitry 15 may be implemented through an interposer medium 16, such as a silicon interposer medium. The interconnect circuitry 14 may include an Embedded Multi-die Interconnect Bridge (EMIB) 17 or other suitable packaging circuitry that is embedded into a substrate 18 as part of the interconnect circuitry 14, such as wires connecting microbumps. The interconnect circuitry 15 may also be implemented according to an interconnect standard for die-to-die data communication onto the EMIB 17.

Although the package 6 is illustrated as containing the chiplet 8 and the transceiver chiplet 10, the package 6 may include any combination of dies, chips, or chiplets. Similarly, the interconnect circuitries 13 and 14 may include any interconnect circuitry technologies and is not limited to AIB circuitry or specific versions of AIB circuitries.

Furthermore, chiplets may be defined as digitally communicative dies, such as integrated circuits equipped with transceivers or transceiver dies, inside a chip. Chiplets may employ one or multiple dies and may have the multiple dies interconnected to form a multi-die chiplet implemented on a chip package substrate. Multiple chiplets may reside inside packaging boundary of a chip. Furthermore, chiplets may also be defined as digitally communicative dies with no packaging boundary in the form of a modular digital circuit, as an example, implemented on a circuit board substrate.

The Advance Interface Bus (AIB) interconnect standard may be implemented within the boundary of a chiplet, such as the chiplet 8 or the transceiver chiplet 10. The interconnect circuitries 13 and 14 in FIG. 1 may provide the FPGA die 9 and the transceiver tile 12, with data transmission and reception interconnect circuitry to create a coherent connection between the chiplet 8 and transceiver chiplet 10 using an AIB connection (or other connection protocol). The AIB (or other protocol) is a physical level interface standard that may define the interface of a digital die in order for a communication with other chiplets. Multiple dies or chiplets may be equipped with the AIB interconnect standard and the like enabling the multiple dies to be interconnected through the EMIB 17.

The interconnect circuitry 13, interconnect circuitry 15 and the interconnect circuitry 14 of FIG. 1 may form a first communicative embodiment using one or more AIB interconnect standards where more than one chiplet or communicative dies are communicatively coupled. The interconnect circuitry 13 and the interconnect circuitry 14 may be compatible and configured to communicate utilizing a data protocol common to the interconnect circuitry 13 and the interconnect circuitry 14. The interconnect circuitry 13 and the interconnect circuitry 14 may be implemented into respective chiplets to utilize features by the common protocol. For example, the protocol (e.g., AIB 1.0 may specify a full swing voltage level (e.g., 0.9 V), a transmission frequency bandwidth (e.g., 2 Gbps), a specific time-division multiplexing setup, a communication protocol, a single data rate, and a specific physical pinout from a die, among other things. In such situations, each of the interconnection circuitries 13 and 14 may include interfaces that communicate using the common settings via a passive interposer as the interposer medium 16.

Figure 2:
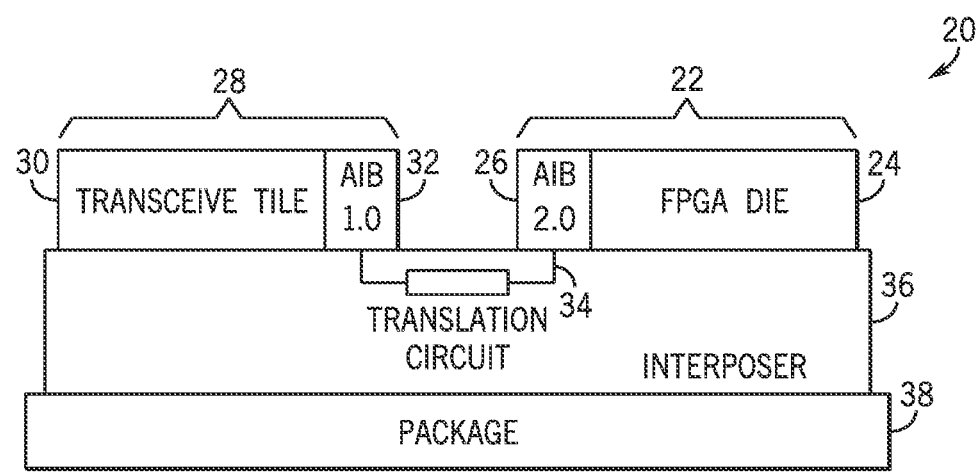
FIG. 2 depicts a package with two chiplets communicatively coupled using two variations of the common interconnect standard, through an active interposer and by the way of a translation circuitry, in accordance with an embodiment.

Package 20 of FIG. 2 may be similar to the package 6 of FIG. 1. However, the interconnection circuitries 13 and 14 may include different protocols or different variations/versions of a common protocol. In other words, the interconnect circuitry 13 uses a first protocol while the interconnection circuitry 14 uses a second protocol. For example, as illustrated, the interconnect circuitry 13 may include AIB 2.0 circuitry using a version 2.0 of AIB while the interconnect circuitry 14 includes AIB 1.0 circuitry using a version 1.0 of AIB.

Since the first version and the second versions used by the interconnection circuitries 13 and 14 may differ, the interconnection circuitries 13 and 14 may use different a swing voltage level (e.g., 0.2 V and 0.4 V), a transmission frequency bandwidth (e.g., 1 Gbps and 4 Gbps), different time-division multiplexing setups, different physical pinout from a die, single and double data rate protocols, and/or different parameters. To address these differences in protocol, the interconnection circuitries 13 and 14 and/or their respective chiplets 8 or 10 may include translation circuitry that may be used to translate the native protocol to another protocol. For example, the transceiver chiplet 10 may include additional translation circuitry to convert from the AIB 1.0 to the AIB 2.0. However, the inclusion of such translations circuitry may add additional space and/or costs to the chiplets 8 and 10 where space and/or costs may not be feasible.

An alternative to translating the protocols in the chiplets 8 and 10 may include adding translation circuitry 34 to the interposer medium 16. Thus, the interposer medium 16, via the translation circuitry 34, may convert the different parameters of the protocols when data is passed between the chiplets 8 and 10. The translation circuitry 34 may include active circuitry incorporated within the interposer medium 16 and/or a silicon (e.g., EMIB) bridge. The translation circuitry 34 may include, among other things, a transceiver adapter that may enable data transmission and reception between circuitry using different versions of data transmission protocols and/or completely different transmission protocols.

The translation circuitry 24 used to translate between different interconnect standards, such as AIB 1.0 and MB 2.0 standards, may enable the packages 6 and/or 20 to have scaling system-on-a-chip integrations. Multiple FPGAs and processors may be communicatively coupled within a processing system by the way of AIB translation circuitry 34 in the interposer medium 16. The implementation of translation circuitry 34 inside the active interposer 36 may enable data communications using higher bandwidths while lower power consumption may be maintained. For example, dies using lower-powered half-swing data communication compared to high voltage swing data communication may be deployed in the packages 6 and 10 and use lower power in communication even when at least one die in the respective package includes a higher power full-swing data communication. Furthermore, by locating the translation circuitry 34 in the interposer and/or other interconnection, the dies may not have increased cost and space while providing flexibility of communication. Furthermore, by enabling packages to communicate using multiple different transmission protocols, the packages may include newer die providing new features and/or communication protocols without waiting for all dies in the package to be updated to the new features and/or protocols. Such flexibility, may enable the packages to be delivered to market more speedily.

Figure 3:
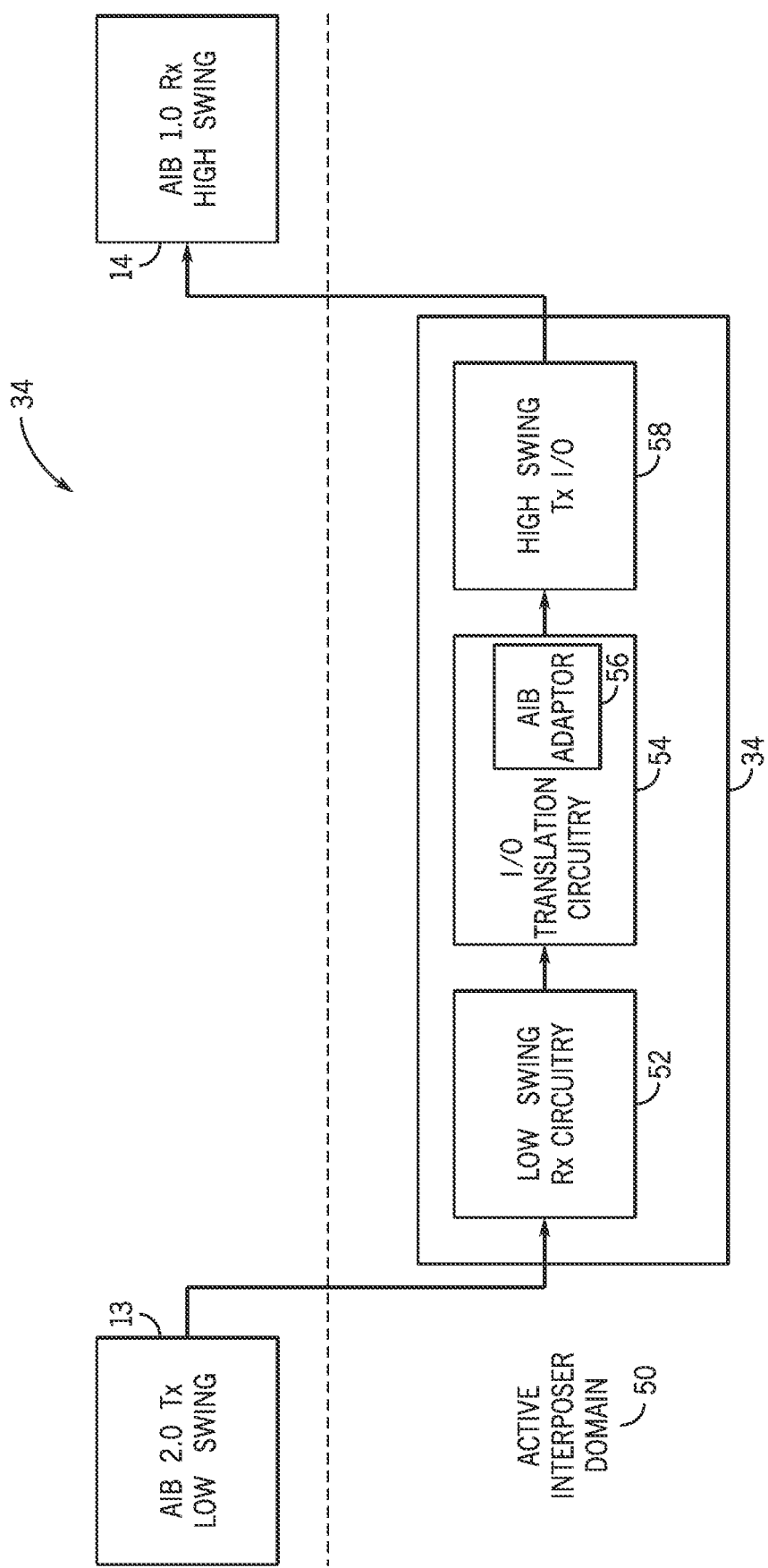
FIG. 3. depicts a package with a block diagram of the translation circuitry of FIG. 2, in accordance with an embodiment.

FIG. 3 depicts an embodiment of the translation circuitry 34 between the interconnect circuitries 13 and 14. As illustrated, the interconnect circuitry 13 may utilize an AIB 2.0 data transmission interface bus. Alternatively, the interconnect circuitry 13 may utilize another suitable transmission mechanism other than AIB 2.0. The interconnect circuitry 14 may utilize an AIB 1.0 data reception interface bus. Alternatively, the interconnect circuitry 14 may utilize another transmission mechanism other than AIB 1.0. AIB 2.0 and AIB 1.0 (or other transmission mechanisms used by the interconnect circuitries 13 and/or 14) may not be compatible for direct transmission and reception of data between the interconnection circuitries 13 and 14. Accordingly and as previously discussed, the translation circuitry 34 may be used to convert between the transmission mechanisms. As illustrated, the translation circuitry 34 may be disposed within an active interposer domain 50 inside the interposer medium 16 and/or the EMIB 17. To perform conversions between transmission mechanisms, the translation circuitry 34 may a low-swing receiver circuitry 52, an input/output translation circuitry 54, an AIB adaptor 56 and a full-swing transmission voltage adaptor 58, among other functional blocks.

As previously discussed, the AIB 2.0 transmitter interface bus may transmit data using a low-swing voltage, as opposed to a high swing voltage used by the AIB 1.0 transmitter interface. For instance, the low-swing voltage may have a first value (e.g., 0.4 V) while the high swing voltage may have a second value (e.g., 0.9 V). The AIB 2.0 transmitter interface bus may also transmit data utilizing a transmission frequency that is higher than the AIB 2.0 transmitter interface bus. For example, the AIB 2.0 transmitter interface bus may transfer data at 4 Gbps using a data encoding scheme.

The translation circuitry 34 inside the active interposer domain 50 may receive a transmitted signal from the interconnect circuitry 13. Based on a configuration of the interconnect circuitry 14, translation circuitry 34 may translate the received signal according to the configuration of the interconnect circuitry 14. The low-swing receiver circuitry 52 may receive the data transmitted by the interconnect circuitry 13. The low-swing receiver circuitry 52 may be configured to receive the data transmitted using a low-swing voltage level. The low-swing receiver circuitry 52 may transmit the received data to the input/output translation circuitry 54.

The data may be adjusted to a level suitable for the input/output translation circuitry 54 that translates the data received from the low-swing receiver circuitry 52 using the levels specified in the low swing configuration. For example, the input/output translation circuitry 54 may receive the data using a frequency specified by the low swing configuration and/or a transmission type (e.g., double-data rate) and buffers the incoming data for transmission to the interconnect circuitry 14. To achieve these results, the input/output translation circuitry 54 may receive the transmitted data by the low-swing receiver circuitry 52 and may perform various conversions on the received data including. The conversion may include converting between a double data rate (DDR) data and a single data rate (SDR) data. The conversion may also include any decoding of the protocol used by the AIB 2.0 data transmission interface bus 46 and encoding the data in the protocol used for reception of data by the AIB 1.0 data reception interface bus. Additionally or alternatively, the conversions may convert between data rates, frequencies, the previously discussed conversions, and the link in any viable order.

The AIB adaptor 56 may be a functional block, residing within the input/output translation circuitry 54 and may account for physical differences between the interconnection mechanisms used by the interconnection circuitries 13 and 14. Although the illustrated AIB adaptor 56 accounts for physical differences between the AIB 1.0 and AIB 2.0 mechanisms. The AIB adaptor 56 may perform rerouting of the transmitted data by the AIB 2.0 interface bus to provided compatibility to the AIB 1.0 interface bus rather than when a device with an AIB 2.0 interface bus is targeted. For instance, the interconnection circuitries 13 and 14 may have aligned connections implemented onto the interposer medium 16, such as microbumps. The AIB adaptor 56 of the active interposer domain 50 may compensate for the differences in the bump alignments used by the interconnect circuitries 13 and 14. Various other physical or mechanical differences, relating to data rate, protocol, and input and/or output signal routing between the AIB 2.0 data transmitter interface bus and the AIB 1.0 data receiver interface bus may be addressed by the AIB adaptor 56.

The full-swing transmission voltage adaptor 58 may translate the low-swing voltage level to a full-swing (or high-swing) voltage level. Thus, the translation circuitry 34 may translate the data received from the interconnection circuitry 13 to a format recognizable by the interconnection circuitry 14 without conversion performed at the interconnection circuitry 14. In other words, the interconnect circuitry 13 may receive data transmitted through the input/output translation circuitry 54 without any protocol or data rate translation after receipt from the translation circuitry 34. Although the illustrated conversion in FIG. 3 converts transmissions from the interconnect circuitry 13 to the interconnect circuitry 14, the translation circuitry 34 may translate data transmitted from the interconnect circuitry 14 to the interconnect circuitry 13 by performing the previously discussed translations performed in the inverse direction/order. Specifically, the translation circuitry 15 may receive a signal with high-swing voltage levels from the interconnection circuitry 14 perform translations in the input/output translation circuitry 54 and output translated values to the interconnect circuitry 13 using the low-swing voltage levels.

When the interconnect circuitries in an exchange both use a same transmission mechanism, a passive interposer may be used and/or the translation circuitry 34 may be bypassed in the interposer medium 16. For example, FIG. 4 may depict a package 80 that includes a chiplet 82 and a transceiver chiplet 84, connected through an interposer medium 86 using a microbump interconnect 88 on substrate 90. The chiplet 82 may include an FPGA die 92 and an AIB 2.0 interconnect circuitry 94. The transceiver chiplet 84 may include a transceiver tile 96 and an AIB 2.0 interconnect circuitry 98. Although the chiplet 82 and the transceiver chiplet 84 are shown to include AIB 2.0 interconnects, any other suitable connections may be deployed. The use of the microbump interconnect 88 may enable high density signals with a coarse pitch, to be used. In other embodiments, any other viable connection may be used to provide die-to-die connection through the passive interposer medium 86. Furthermore, the interposer medium 86 and the substrate 90 may be implemented in different embodiments as two separate domains or as a single domain. The use of two interconnects using a same standard (e.g., AIB 2.0 interconnect standard) for data communication between the FPGA die 92 and the transceiver tile 96 may allow for passive connection between the interface circuitry without using any conversion between the FPGA die 92 and the transceiver tile 96. The two AIB 2.0 interfaces may communicate using a common (e.g., low-swing voltage level) and a common (e.g., high-speed frequency), among other things. In some embodiments, the interposer medium 16 and/or the interposer medium 86 may include and/or use selection circuitry (e.g., a multiplexer) to control whether an interconnection uses or bypasses the translation circuitry 34.

Figure 4:
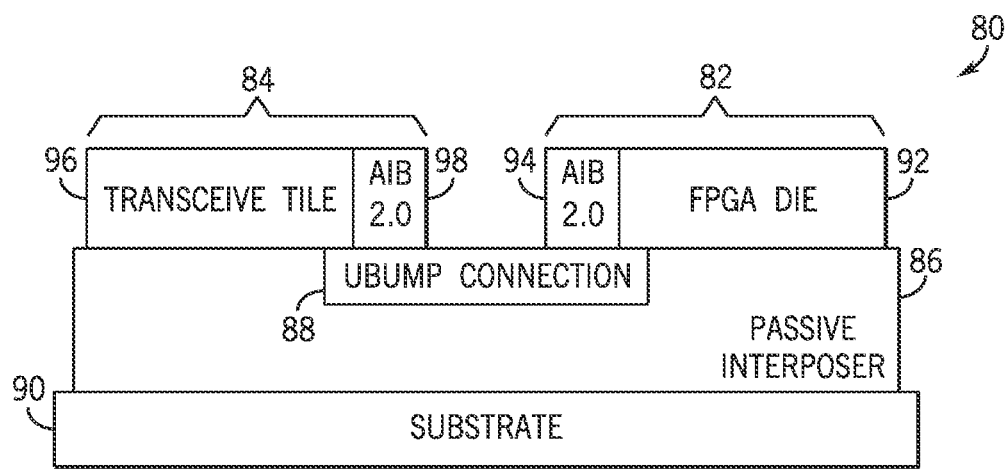
FIG. 4 depicts a package with two chiplets communicatively coupled using a variation of the common interconnect standard, by the way of a passive domain and through an interconnect circuitry.
Figure 5:
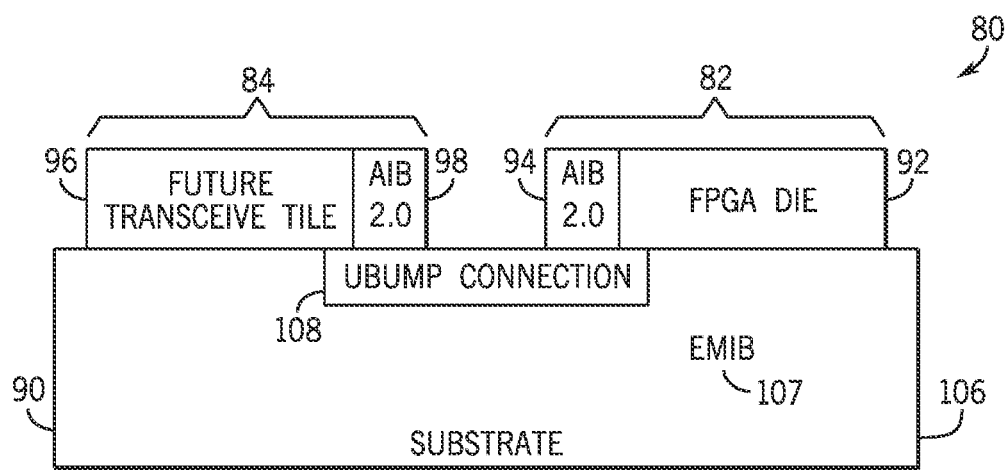
FIG. 5 depicts a package with two chiplets communicatively coupled using a variation of the common interconnect standard, through a passive domain and by the way of an interconnect bridge, in accordance with an embodiment.

The package 80 may use different interconnect mechanisms that the microbump interconnect 88 and the passive interposer medium 86 illustrated in FIG. 4. For example, FIG. 5 illustrates an embodiment of the package 80 that includes the chiplet 82 and the transceiver chiplet 84, interconnected through an interposer medium 106, incorporating an Embedded Multi-die Interconnect Bridge (EMIB) 107 and a microbump interconnect 108 rather than the passive interposer medium 86. In some embodiments, another interconnections may be used in addition to or alternative to the microbump interconnect 108 to provide a die-to-die connection through the interposer medium 86. The use of EMIB 107 within the package 80 may enable a reliable data communication due to lower parasitic resistance and capacitance compared to the use of the interposer medium 86 of FIG. 4. Otherwise all other aspects of the discussion related to FIG. 4 may be applicable to the package 80 of FIG. 5.

Figure 6:
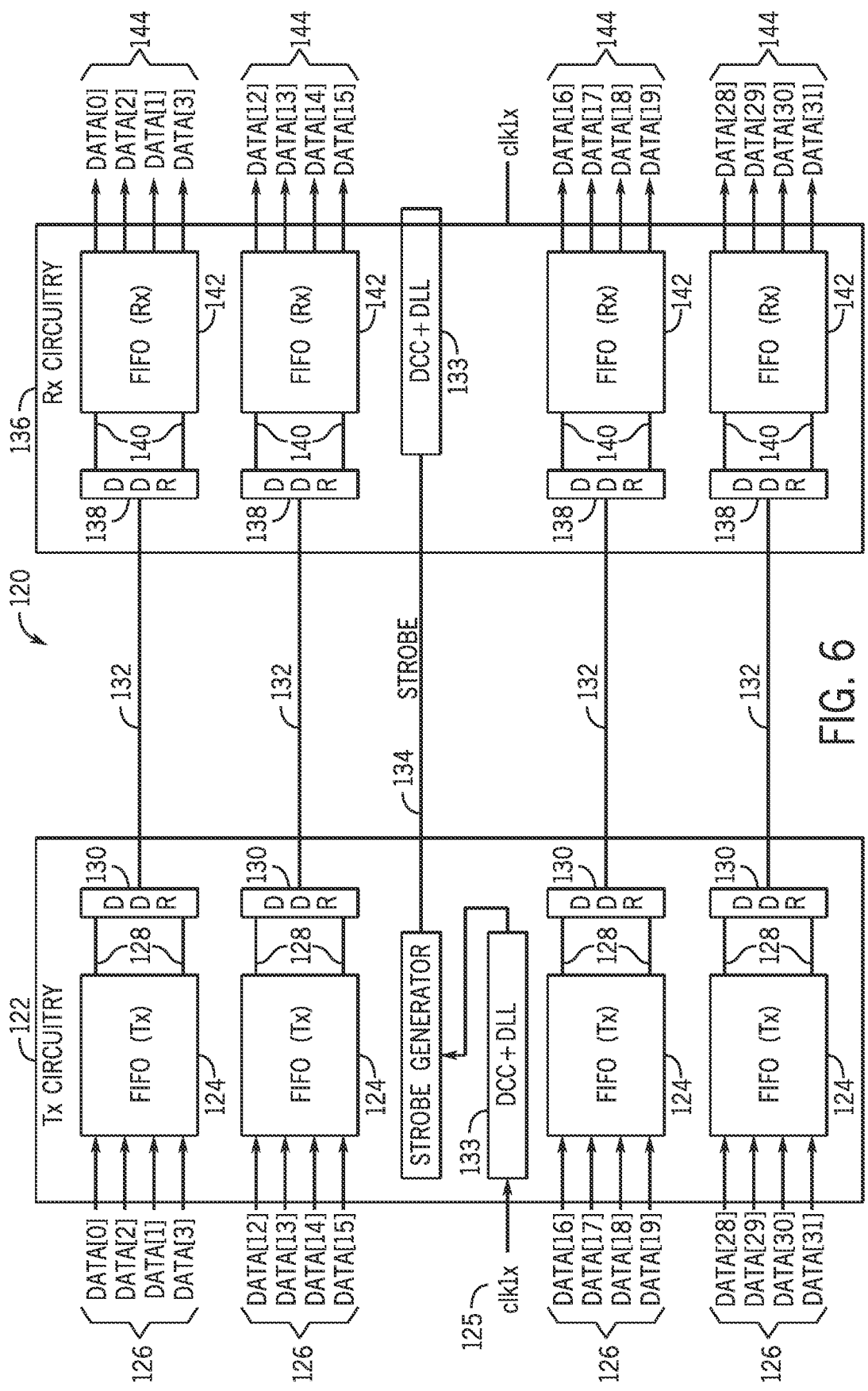
FIG. 6 depicts an transmitter circuitry and receiver circuitry coupled between chiplets of the package of FIG. 1, in accordance with an embodiment.

Since the frequency of the interconnection may be higher than a frequency of the dies involved in the connection, time-division multiplexing (TDM) or pumping (e.g., quad pumping). For instance, if an interconnection between dies uses a frequency greater than 4 Gbsp, but an FPGA die involved in the connection is capped at 1 GHz, quad-pumping or TDM may be used to inject data into the interconnect to utilize available throughput in the connection. FIG. 6 illustrates an embodiment of an interconnection 120 between transmitter circuitry 122 and receiver circuitry 136. For instance, the transmitter circuitry 122 may include the chiplet 82 while the receiver circuitry 136 may include the transceiver chiplet 84. As illustrated, data may be transmitted and received using a quadruple data rate and/or a quad-pumping signaling technique. The transmitter circuitry 34 may utilize multiple First-in, First-out (FIFOs) 124. Each FIFO 124 may receive a number of (e.g., four) data bits 126 at a first frequency rate designated by a signal 125. The received data is encoded using the first frequency rate using single data rate (SDR) technique. The FIFO 124 then transmits the received data bits 126 using a second frequency rate, such as a frequency twice that of the first frequency rate. This second frequency rate may enable data transmission using two data lines 128 for each FIFO 124. A double-data-rate (DDR) data transmitter circuitry 130 may then be used to encode a portion (e.g., two) of the received data bits 126, by the way of data lines 128, using rising and falling edges of a single clock cycle for transmission using a transmission line 132. A reference clock strobe 134 may also be transmitted across the interconnection to provide a transition from a clock domain of the transmitter circuitry 122 to a clock domain of the receiver circuitry 136. In some embodiments, where the translation circuitry 34 is deployed between the transmitter circuitry 122 and the receiver circuitry 136, data may cross additional clock domains in transition from the transmitter circuitry 122 to the receiver circuitry 136. The reference clock strobe 134 may include clock information such as duty cycle correction and/or delay locked loop 133 at one or more stages in transferring from the clock domain from the transmitter circuitry 122 to the clock domain of the receiver circuitry 136.

The receiver circuitry 136 may utilize DDR receiver circuitry 138 to receive the transmitted data using the second frequency rate (or another frequency rate due to translation in the translation circuitry 34). Each DDR receiver circuitry 138 may translate the received DDR data by the way of a respective transmission line 132, to SDR data on two transmission lines 140 using a respective frequency rate. The data in the transmission lines 140 may then be received by a FIFO 142 to be transmitted to a circuitry.

Figure 7:
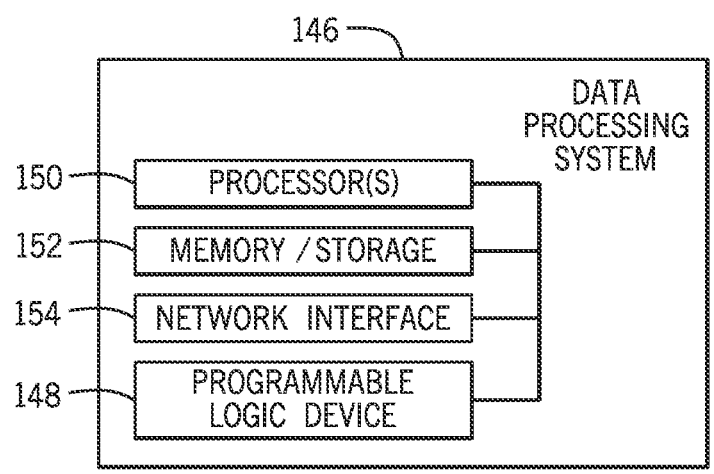
FIG. 7 depicts a data processing system that may utilize the translation circuitry of FIG. 1 for communication and interconnection, in accordance with an embodiment.

The transmitter circuitry 122 and the receiver circuitry 136 of the FIG. 7 may be implemented inside a suitable interposer medium or bridge. The transmission circuit 120 may be further enhanced to compensate for various differences between receiving and transmitting circuitries using the translation circuitry 34, such as but not limited to, physical differences, routing mismatches, encoding technique differences, protocol type differences and data rate differences, among other things. Furthermore, it may be appreciated that the actual implementation of the design may utilize other circuitry in various forms and different architecture.

A programmable logic device 148 may be a data processing system or may be a component of a data processing system. For example, the programmable logic device 148 may be a component of a data processing system 146, shown in FIG. 8. The data processing system 146 includes a processor 150, memory and/or storage circuitry 152, and a network interface 154. The data processing system 146 may present viable embodiments that may utilize the translation circuitry 34. The data processing system 146 may include more or fewer components (e.g., electronic display, user interface structures, application specific integrated circuits (ASICs)). The processor 150 may include any suitable processor, such as an INTEL® XEON® processor or a reduced-instruction processor (e.g., a reduced instruction set computer (RISC), an Advanced RISC Machine (ARM) processor) that may manage a data processing request for the data processing system 146 (e.g., to perform machine learning, video processing, voice recognition, image recognition, data compression, database search ranking, bioinformatics, network security pattern identification, spatial navigation, or the like). The memory and/or storage circuitry 152 may include random-access memory (RAM), read-only memory (ROM), one or more hard drives, flash memory, or the like. The memory and/or storage circuitry 152 may be considered external memory to the programmable logic device 148 and may hold data to be processed by the data processing system 146. In some cases, the memory and/or storage circuitry 152 may also store configuration programs (e.g., bitstream) for programming the programmable logic device 148. The network interface 154 may enable the data processing system 146 to communicate with other electronic devices and may perform the communication by the way of a translation circuitry, such as translation circuitry 49, 69 or any viable alternative translation circuitry for communication with a target component. Furthermore, the processor 150, the programmable logic device 148 and/or the memory and/or storage circuitry 152 may utilize different communication features and may benefit from the translation circuitry 34. The use of the translation circuitry 34 in between the functional blocks of the data processing system 146 may reduce the size of each functional block and may allow reduced power consumption, among other things.

In one example, the data processing system 146 may be part of a data center that processes a variety of different requests. For instance, the data processing system 146 may receive a data processing request via the network interface 154 to perform machine learning, video processing, voice recognition, image recognition, data compression, database search ranking, bioinformatics, network security pattern identification, spatial navigation, or some other specialized task. The processor 150 may cause the programmable logic fabric of the programmable logic device 148 to be programmed with a particular accelerator related to requested task. For instance, the processor 150 may instruct that configuration data (bitstream) stored on the memory and/or storage circuitry 152 or cached in sector-aligned memory of the programmable logic device 148 to be programmed into the programmable logic fabric of the programmable logic device 148. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 148 that are described here, the programmable logic device 148 may rapidly assist the data processing system 146 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

Placement of computation and memory in spatial architectures where compute and memory have three-dimensional spatial locality may be performed statically. Additionally or alternatively, the programmable logic device 148 may dynamically allocate, relocate, and de-allocate compute and memory on such spatial architectures. These techniques enable the static mapping and dynamic management of systems using such architectures. Moreover, using flexible allocation schemes enables the programmable logic device 148 to find and support optimal co-placement of compute with memory in a static setting in a known sequence of static settings and in a dynamic setting when the allocation of compute and memory is not known a priori. Such usage of static and/or dynamic placement in a three-dimensional spatial locality provides the ability to extend compilation to support the simultaneous synthesis, placement, and routing of spatial computation with a spatially distributed memory to enable users to leverage an architecture with a much richer memory sub-system. The support for dynamic management of the computation and memory allows users/administrators to build dynamic runtime systems for spatial architectures for the programmable logic device 148.

Furthermore, the translation circuitry 34 provides backwards compatibility on an interposer and/or bridge to provide flexibility of using different technologies for the data processing system 146. For instance, the data processing system 146 with the translation circuitry 34 to readily be changed between different protocols for reduced time to market for each sub-component. For instance, new technologies may be used with other technologies (e.g., medium-dependent interface (MDI)) without redesigning pre-existing devices using the other technologies or designing the new technologies to have backwards compatibility incorporated therein. Such backwards compatibility may enable direct communication between processors (e.g., INTEL XEON®) while reducing system latency for the data processing system 146 compared to alternative tile interconnect approaches. Furthermore, any potential mechanical and/or physical differences between protocols across an interconnection may be handled by using additional trips across an interconnect bridge or passive interposer.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A system, comprising:
   a plurality of die;
   an active interposer coupled to the plurality of die, wherein the active interposer comprises translation circuitry configured to:
   receive data from a first die of the plurality of die using a first frequency;
   translate, inside the active interposer, the data received using the first frequency to a second frequency associated with a second die of the plurality of die, the second die being coupled to the active interposer; and
   transmit the translated data to the second die with the second frequency.

2. The system of claim 1, wherein the first frequency is associated with a first communication protocol used by the first die and the second frequency is associated with a second communication protocol used by the second die.

3. The system of claim 1, wherein transmitting the data to the second die comprises routing the data to the second die via one or more microbumps that couple the active interposer to the second die.

4. The system of claim 1, wherein the first frequency is slower than the second frequency.

5. The system of claim 1, wherein the translation circuitry receives the data from the first die in a single data rate format and translates the data to a double data rate format associated with the second die before transmitting the translated data.

6. The system of claim 1, wherein the translation circuitry receives the data from the first die with a first swing voltage and translates the first swing voltage to a second swing voltage associated with the second die before transmitting the translated data.

7. The system of claim 2, wherein the active interposer is configured to route the data from the first die to the second die by bypassing the translation circuitry when the first communication protocol and the second communication protocol are a same communication protocol.

8. A method, comprising:
receiving, at an active interposer, data from a first die coupled to the active interposer, wherein the data is received from the first die using a first frequency;
translating, by the active interposer and inside the active interposer, the first frequency of the data to a second frequency associated with a second die coupled to the active interposer; and
transmitting, by the active interposer, the translated data to the second die with the second frequency.

9. The method of claim 8, wherein the first frequency is associated with a first communication protocol used by the first die and the second frequency is associated with a second communication protocol used by the second die.

10. The method of claim 9, wherein the first communication protocol is an Advanced Interface Bus 1.0 (AIB 1.0) communication protocol and the second communication protocol is an MB 2.0 communication protocol.

11. The method of claim 8, wherein the first frequency is equal to or below 1 GHz and the second frequency is greater than 4 GHz.

12. The method of claim 8, comprising:
receiving, at the active interposer, the data from the first die in a single data rate format;
translating, by the active interposer and inside the active interposer, the data to a double data rate format associated with the second die; and
transmitting, by the active interposer, the translated data to the second die with the double data rate format.

13. The method of claim 8, comprising:
receiving, at the active interposer, the data from the first die with a first swing voltage;
translating, by the active interposer and inside the active interposer, the first swing voltage of the data to second swing voltage associated with the second die; and
transmitting, by the active interposer, the translated data to the second die using the second swing voltage.

14. The method of claim 8, wherein transmitting the data to the second die comprises routing the data, by the active interposer, to the second die via one or more microbumps that couple the active interposer to the second die.

15. An active interposer for a plurality of die, comprising:
translation circuitry configured to translate a first frequency of data received from a first die coupled to the active interposer to a second frequency inside the active interposer, wherein the second frequency is associated with a second die coupled to the active interposer; and
routing circuitry configured to electrically connect the plurality of die together, wherein the routing circuitry is configured to provide the translated date to the second die.

16. The active interposer of claim 15, wherein the active interposer receives the data with the first frequency from the first die, translates the first frequency of the data to the second frequency associated with the second die, and transmits the translated data using the second frequency to the second die.

17. The active interposer of claim 15, wherein the translation circuitry is configured to receive the data from the first die with a single data rate format and transmit the data using a double data rate format to the second die.

18. The active interposer of claim 15, wherein the translation circuitry is configured to receive the data from the first die with a first swing voltage, translate the first swing voltage of the data to a second swing voltage associated with the second die, and transmit the data using to the second die using the second swing voltage.

19. The active interposer of claim 15, wherein the first frequency is associated with a first communication protocol used by the first die and the second frequency is associated with a second communication protocol used by the second die.

20. The active interposer of claim 19, wherein the active interposer is configured to route the data from the first die to the second die by bypassing the translation circuitry when the first protocol and the second protocol are a same protocol.

* * * * *